United States Patent [19]
Lesk

[11] Patent Number: 5,389,576
[45] Date of Patent: Feb. 14, 1995

[54] METHOD OF PROCESSING A POLYCIDE STRUCTURE

[75] Inventor: Israel A. Lesk, Phoenix, Ariz.

[73] Assignee: Motorola, Inc., Schaumburg, Ill.

[21] Appl. No.: 997,425

[22] Filed: Dec. 28, 1992

[51] Int. Cl.$^6$ .................. H01L 21/44; H01L 21/48
[52] U.S. Cl. .................. 437/200; 148/DIG. 147; 437/238; 437/248
[58] Field of Search .................. 437/200, 238, 248; 148/DIG. 147

[56] References Cited

U.S. PATENT DOCUMENTS

| | | | |
|---|---|---|---|
| 5,075,251 | 12/1991 | Torres et al. | 437/200 |
| 5,147,820 | 9/1992 | Chittipeddi et al. | 437/41 |
| 5,168,332 | 12/1992 | Kunishima et al. | 257/385 |

OTHER PUBLICATIONS

R. Tromp et al, "Silicon Oxidation Studies" J. Electro Chem. Soc: Solid–State Science and Technol., vol. 125. No. 10, pp. 1708–1714, Oct. 1978.

E. A. Irene, "Silicon Oxidation Studies: Some Aspects of the Initial Oxidation Regime" Journal of the Electrochemical Society: Solid–State Science and Technology, vol. 125, No. 10, pp. 1708–1714, Oct. 1978.

R. Tromp et al, "High Temperature SiO$_2$ Decomposition at the SiO$_2$/Si Interface", Physical Review Letters, vol. 55, No. 21, pp. 2332–2335, Nov. 18, 1985.

K. Hofman et al, "Defect Formation In Termal SiO$_2$ by High–Temperature Annealing", Applied Physics Letter, vol. 49, No. 22, pp. 1525–1527, Dec. 1, 1992.

Primary Examiner—Olik Chaudhuri
Assistant Examiner—C. Everhart
Attorney, Agent, or Firm—Joe E. Barbee

[57] ABSTRACT

A method substantially eliminating consumption of silicon from semiconductor devices is provided. The method includes controlling gases within the environment wherein the semiconductor device is positioned. The environment is formed to include an inert gas and oxygen. The oxygen content is formed to have a concentration between approximately $1 \times 10^1$ and $1 \times 10^5$ parts per million. Such an oxygen concentration substantially prevents converting silicon from the semiconductor device into silicon monoxide thereby substantially eliminating silicon consumption.

8 Claims, 1 Drawing Sheet

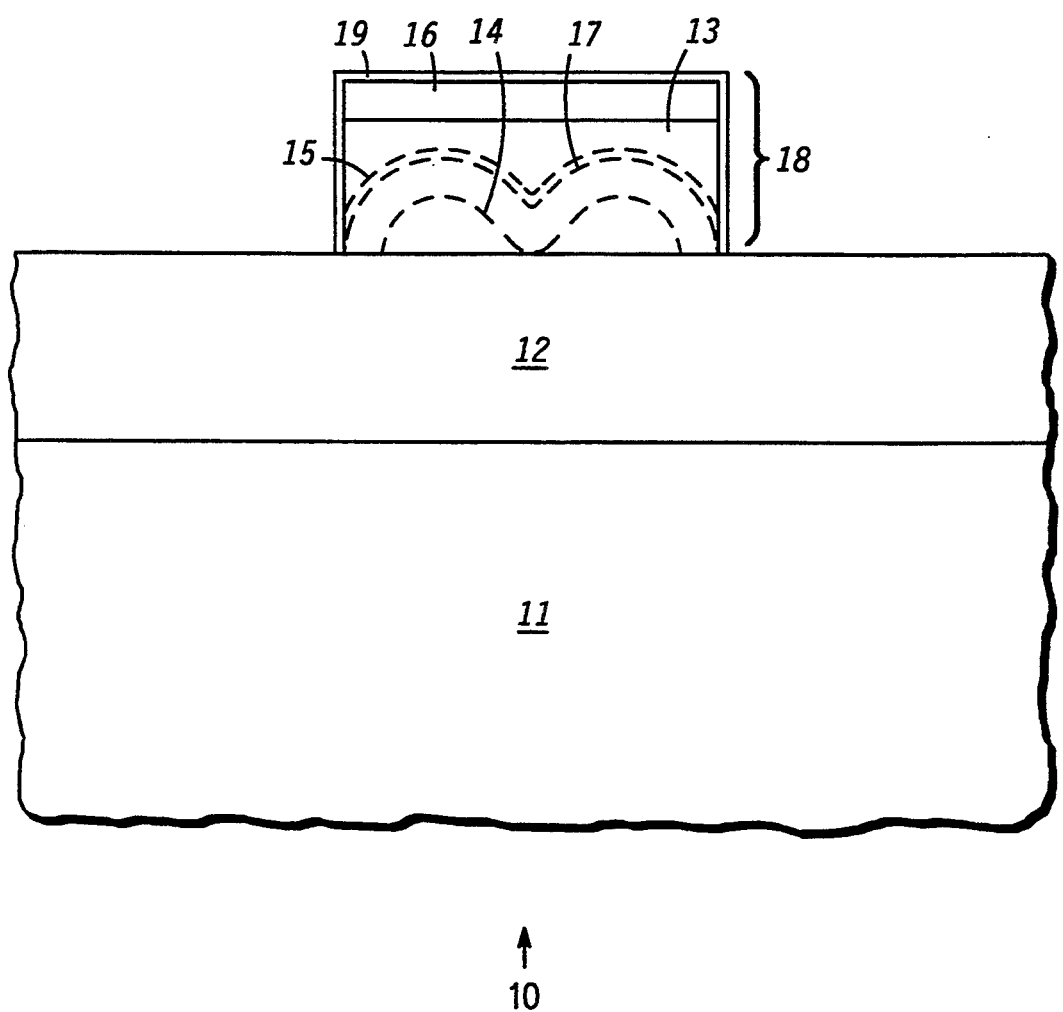

METHOD OF PROCESSING A POLYCIDE STRUCTURE

BACKGROUND OF THE INVENTION

The present invention relates, in general, to semiconductor processing, and more particularly, to a semiconductor structure processing method using a novel environmental gas mixture.

The semiconductor industry previously has utilized polycide in the formation of various low resistance semiconductor device structures including conductors and gate electrodes of field effect transistors. The polycide generally includes a polysilicon layer that is covered by a metal silicide. During the formation of semiconductor devices utilizing polycide, it is often necessary to expose the polycide to high temperatures, greater than approximately 900 degrees Celsius (900° C.). Such exposure typically occurs during subsequent processing operations such as high temperature drive-in of ion implants. At the high temperatures, localized regions of the polycide often deform resulting in a concave or slumping shape in the localized region. It is difficult to maintain low resistance connections to such slumping structures. Often, the slumping is sufficiently severe to allow the metal silicide to contact underlying layers and structures thereby degrading the device's operating characteristics.

Accordingly, it is desirable to have a method of heating polycide that does not cause the polycide to deform, and that does not result in concave or slumping polycide structures.

SUMMARY OF THE INVENTION

Briefly stated, the present invention includes an environmental gas mixture that substantially eliminates consumption of silicon from a semiconductor device. The environment wherein the semiconductor device is positioned is formed to include an inert gas and oxygen. The oxygen content is formed to have a concentration between approximately $1 \times 10^1$ and $1 \times 10^5$ parts per million. Such an oxygen concentration substantially prevents converting silicon from the semiconductor device into silicon monoxide thereby substantially eliminating silicon consumption.

BRIEF DESCRIPTION OF THE DRAWINGS

The sole Figure illustrates an enlarged cross-sectional portion of a semiconductor device in accordance with the present invention.

DETAILED DESCRIPTION OF THE DRAWINGS

The sole Figure illustrates a portion of a semiconductor device 10 having a polycide structure 18. Device 10 includes a silicon substrate 11, a silicon dioxide layer 12 covering substrate 11, and polycide structure 18 that is positioned on layer 12. Polycide structure 18 includes a polysilicon layer 13 and a refractory metal silicide layer 16 that is on a top surface of layer 13. In the preferred embodiment, layer 13 is doped polysilicon, and layer 16 is tungsten silicide having an as deposited silicon atomic fraction of approximately 2.6. A silicon dioxide layer 19 is formed on the sidewalls of layers 13 and 16, and on the surface of layer 16 in order to cover structure 18.

A dashed line 14, a dashed line 15, and a dashed line 17 illustrate slumping that can result from heating a polycide structure to high temperatures, above approximately 900° C. Dashed lines 14, 15, and 17 indicate possible positions of a slumped polysilicon layer, a slumped silicon dioxide layer, and a slumped metal silicide layer, respectively, of a slumped polycide structure. It is believed that micro-voids or pinholes in the silicon dioxide layer expose the underlying polycide structure to oxygen that is present in the processing atmosphere or environment. Although the high temperature processing operation generally is performed in an inert environment, such as nitrogen, it is difficult to remove all of the oxygen and water vapor from the environment. The environment often includes small residual amounts of oxygen, as shown in Table 1, that react with the polycide structure. Also, excess water vapor ($H_2O$) in the environment can supply such oxygen quantities. During the high temperature, above 900° C. processing operations, silicon atoms from the polysilicon layer diffuse through the metal silicide layer. Because of the micro-voids in the silicon dioxide layer, the oxygen reacts with the silicon atoms that migrate through the metal silicide layer. Since the silicon diffusing through the metal silicide layer is in atomic form, it is very reactive when it reaches the microvoid. Therefore, it rapidly reacts with the oxygen. Due to the low oxygen content, the silicon and oxygen reaction forms a silicon monoxide (SiO) gas that evolves into the environment resulting in consumption of silicon from the polycide structure. As silicon is consumed, the polysilicon layer develops a concave or slumping shape such as illustrated by dashed line 14. The overlying refractory metal silicide layer conforms to the deformed polysilicon layer, as illustrated by dashed line 17, thereby resulting in a slumping polycide structure that generally is unusable.

It has been found that adding a small amount of oxygen into such a substantially inert environment substantially prevents converting silicon from structure 18 into silicon monoxide. Therefore, consumption of silicon from structure 18 and slumping of structure 18 is substantially eliminated. This may seem the opposite of what could be expected based on the silicon monoxide formation described hereinbefore. It would at first appear that additional oxygen would facilitate consumption of silicon at a faster rate than in the inert atmosphere. However, the additional oxygen facilitates converting the silicon diffusing through layer 16 into silicon dioxide thereby filling the micro-voids in layer 19. As the micro-voids are filled, the diffusion of silicon from layer 13 to the surface is substantially eliminated thereby substantially eliminating consumption of silicon from layer 13 and the associated slumping of structure 18.

If the additional oxygen content is small enough, the thickness of layer 19 and the thickness of silicon dioxide on other portions of device 10 will remain substantially constant. If too much oxygen is added, the thickness of exposed oxidized portions of device 10 will be increased thereby degrading device 10. Consequently, the amount of oxygen has to be carefully controlled. The amount of oxygen required to prevent consumption of silicon from layer 13 depends on the temperature used for heating structure 18. Table 1, below, indicates suitable oxygen contents for various temperatures. For other temperatures, the oxygen content can be extrapolated from Table 1.

TABLE 1

| TEMP. | TYPICAL RESIDUAL CONTENT (PPM) | SUITABLE OXYGEN CONTENT (PPM) | APPROXIMATE OXYGEN CONTENT (PPM) OF PREFERRED EMBODIMENT |
|---|---|---|---|
| 1100° C. | $0-1 \times 10^3$ | $2 \times 10^3 - 1 \times 10^5$ | $1 \times 10^4$ |
| 1000° C. | $0-1 \times 10^2$ | $2 \times 10^2 - 1 \times 10^4$ | $1 \times 10^3$ |
| 900° C. | $0-1 \times 10^1$ | $2 \times 10^1 - 1 \times 10^2$ | $1 \times 10^2$ |

The oxygen contents shown in Table 1 are well above the oxygen and water vapor contamination level, generally less than approximately one PPM, found in nitrogen and other inert processing gasses.

It is believed that this novel gas mixture also is applicable to the formation of silicon dioxide layer 12 on silicon substrate 11. After forming a silicon dioxide layer on a silicon wafer, the silicon dioxide layer typically has small, less than approximately one nanometer wide, voids that expose portions of the underlying silicon substrate. Subsequent to forming the silicon dioxide layer, the wafers are often cooled from the high processing temperature in an environment of pure nitrogen. Oxygen and water residuals or contaminants in the nitrogen can facilitate forming silicon monoxide that consumes silicon from both the substrate and the silicon dioxide layer thereby enlarging the voids. As the substrate and the silicon dioxide layer are cooling, silicon exposed by a void reacts with the adjacent silicon dioxide layer to form a silicon monoxide gas ($SiO_2 + Si \rightarrow 2SiO$). The silicon monoxide gas evolves through the micro-void into the environment and is lost. Thus, silicon is consumed from both the substrate and from sidewalls of the void, thereby increasing the size of the void.

By cooling substrate 11 and layer 12 with an inert gas and oxygen using the oxygen contents shown in the Table 1, the exposed silicon reacts with the environmental oxygen to form silicon dioxide thereby substantially eliminating expansion of any voids in layer 12.

By now it should be appreciated that there has been provided a novel method of heating or cooling semiconductor device structures formed from polycide or silicon dioxide. By using an atmosphere containing an inert gas, such as nitrogen, with an oxygen content that varies based on the temperature, silicon consumption is substantially eliminated. Using such a gas during processing of polycide structures produces structures that are not deformed. Using such a gas mixture for cooling silicon dioxide layers substantially eliminates enlarging small voids in the silicon dioxide layer.

I claim:

1. A method of processing a polycide structure comprising:
    providing a silicon wafer;
    forming a layer of silicon dioxide on the silicon wafer;
    applying a layer of doped polysilicon on a portion of the silicon dioxide;
    forming a layer of tungsten silicide on the doped polysilicon;
    covering the tungsten silicide and the doped polysilicon with silicon dioxide; and
    heating the silicon dioxide, the doped polysilicon and the tungsten silicide to a temperature greater than approximately 900° C. in an environment consisting substantially of nitrogen and oxygen wherein the oxygen has a concentration between approximately $1 \times 10^1$ and $1 \times 10^5$ parts per million for the purpose of substantially preventing conversion of silicon in the doped polysilicon layer to silicon monoxide.

2. The method of claim 1 wherein covering the doped polysilicon with the layer of tungsten silicide includes using tungsten silicide having an as deposited silicon atomic fraction of approximately 2.6.

3. A method of processing polycide comprising: providing a polycide structure having a layer of silicon dioxide covering a refractory metal silicide wherein the refractory metal silicide is on a layer of polysilicon; and
    heating the polycide structure in an environment having an inert gas and an oxygen concentration between approximately $1 \times 10^1$ and $1 \times 10^5$ parts per million for the purpose of substantially preventing conversion of the polysilicon to silicon monoxide.

4. The method of claim 3 wherein providing the polycide structure includes using tungsten silicide as the refractory metal silicide.

5. The method of claim 4 wherein using tungsten silicide includes using tungsten silicide having an as deposited silicon atomic fraction of approximately 2.6.

6. The method of claim 3 wherein heating the polycide structure includes heating the polycide structure to a temperature of at least 900° C.

7. A method of processing a semiconductor device comprising:
    providing a silicon wafer having a layer of silicon dioxide on a surface of the wafer wherein the silicon wafer and the layer of silicon dioxide have a temperature of at least 900° C.; and
    cooling the semiconductor wafer in an environment having an inert gas and oxygen, the oxygen having a concentration between approximately $1 \times 10^1$ and $1 \times 10^5$ parts per million.

8. The method of claim 7 wherein providing the silicon wafer includes providing the silicon wafer having a polycide structure on at least a portion of the layer of silicon dioxide.

* * * * *